(12) United States Patent
Kwak et al.

(10) Patent No.: US 10,236,065 B2
(45) Date of Patent: *Mar. 19, 2019

(54) NONVOLATILE MEMORY DEVICE INCLUDING MULTI-PLANE STRUCTURE

(71) Applicant: SAMSUNG ELECTRONICS CO., LTD., Suwon-si, Gyeonggi-do (KR)

(72) Inventors: Donghun Kwak, Hwaseong-si (KR); Daeseok Byeon, Seongnam-si (KR); Chiweon Yoon, Seoul (EG)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/049,863

(22) Filed: Jul. 31, 2018

(65) Prior Publication Data

US 2018/0366199 A1    Dec. 20, 2018

Related U.S. Application Data

(63) Continuation of application No. 15/342,027, filed on Nov. 2, 2016, now Pat. No. 10,056,148.

(30) Foreign Application Priority Data

Nov. 12, 2015    (KR) .......................... 10-2015-0158944

(51) Int. Cl.
*G11C 11/00* (2006.01)
*G11C 16/08* (2006.01)
*G11C 16/04* (2006.01)

(52) U.S. Cl.
CPC .......... *G11C 16/08* (2013.01); *G11C 16/0483* (2013.01)

(58) Field of Classification Search
CPC . G11C 16/0483; G11C 16/10; G11C 16/3427; G11C 16/26; G11C 16/08; G11C 16/30; G11C 16/12; G11C 11/4085; G11C 7/12; G11C 16/24

See application file for complete search history.

(56) References Cited

U.S. PATENT DOCUMENTS

| | | | |
|---|---|---|---|
| 7,212,439 | B2 | 5/2007 | Park |
| 7,679,133 | B2 | 3/2010 | Son et al. |
| 8,520,440 | B2 | 8/2013 | Ahn et al. |
| 8,542,532 | B2 | 9/2013 | Chen et al. |
| 8,553,466 | B2 | 10/2013 | Han et al. |
| 8,559,235 | B2 | 10/2013 | Yoon et al. |
| 8,654,587 | B2 | 2/2014 | Yoon et al. |
| 8,873,290 | B2 | 10/2014 | Cho et al. |
| 8,923,048 | B2 | 12/2014 | Rabkin et al. |
| 8,947,933 | B2 | 2/2015 | Tokiwa et al. |

(Continued)

*Primary Examiner* — Hien N Nguyen
(74) *Attorney, Agent, or Firm* — Volentine, Francos & Whitt, PLLC

(57) ABSTRACT

A nonvolatile memory device includes a memory cell array having a first plane and a second plane and an address decoder connected to the first plane through first string select lines and connected to the second plane through second string select line. The address decoder provides a string select signal and a string unselect signal to the first and second string select lines. The address decoder independently provides the string select signal and the string unselect signal to the first and second string select lines in each plane based on different string select line addresses corresponding to the first and second planes.

15 Claims, 13 Drawing Sheets

(56) References Cited

U.S. PATENT DOCUMENTS

| | | |
|---|---|---|
| 9,053,765 B2 | 6/2015 | Fukano |
| 10,056,148 B2 * | 8/2018 | Kwak .................... G11C 16/08 |
| 2011/0233648 A1 | 9/2011 | Seol et al. |
| 2011/0292737 A1 | 12/2011 | Choi |
| 2014/0160847 A1 | 6/2014 | Kwak |
| 2014/0192594 A1 | 7/2014 | Lue |
| 2016/0011779 A1 | 1/2016 | Lee |

* cited by examiner

NONVOLATILE MEMORY DEVICE INCLUDING MULTI-PLANE STRUCTURE

CROSS-REFERENCE TO RELATED APPLICATIONS

This is a Continuation of U.S. application Ser. No. 15/342,027, filed Nov. 2, 2016, which is claims priority under 35 USC § 119 to Korean Patent Application No. 10-2015-0158944, filed on Nov. 12, 2015, the entirety of which is hereby incorporated by reference.

BACKGROUND

The present disclosure relates to semiconductor memory devices and, more particularly, to a nonvolatile memory device including a multi-plane structure.

A storage device is a device that stores data according to the control of a host device, such as a computer, a smartphone, and a smart pad. Storage devices include a device that stores data in a magnetic disk, such as a hard disk drive (HDD), a solid state drive (SSD), and a device that stores data in a semiconductor memory such as a memory card, particularly a nonvolatile memory device.

Nonvolatile memory devices may include a read only memory (ROM), a programmable ROM (PROM), an electrically programmable ROM (EPROM), an electrically erasable and programmable ROM (EEPROM), a flash memory device, a phase change RAM (PRAM), a magnetic RAM (MRAM), a resistive RAM (RRAM), and a ferroelectric RAM (FRAM).

In recent years, many studies have been conducted on a semiconductor memory device including memory cells that are three-dimensionally stacked to improve integration density of the semiconductor memory device. A three-dimensional memory device may include a plurality of planes.

SUMMARY

The present disclosure relates to a nonvolatile memory device including a multi-plane structure that may independently select cell strings in each plane.

A nonvolatile memory device according to example embodiments of the disclosure includes a memory cell array having a first plane and a second plane and an address decoder connected to the first plane through first string select lines and connected to the second plane through second string select lines. The address decoder provides a string select signal and a string unselect signal to the first and second string select lines. The address decoder may independently provide the string select signal and the string unselect signal to the first and second string select lines in each plane based on different string select line addresses corresponding to the first and second planes.

A nonvolatile memory device according to example embodiments of the disclosure includes a memory cell array having a plurality of planes and an address decoder connected to each of the planes through a plurality of string select lines. The address decoder provides a string select signal and a string unselect signal to each of the planes. The address decoder may divide the planes into a plurality of groups and independently provide the string select signal and the string unselect signal based on a different string select line address corresponding to each of the groups.

A nonvolatile memory device according to example embodiments of the disclosure includes a memory cell array having a first plane of first memory cell strings and a second plane of second memory cell strings. Each of the first and second memory cell strings includes a plurality of memory cells connected electrically in series. The first memory cell strings are selected or unselected for accessing the memory cells of the first memory cell strings in accordance with signals applied to first string selection lines. The second memory cell strings are selected or unselected for accessing the memory cells of the second memory cell strings in accordance with signals applied to second string selection lines. None of the first string selection lines being the same string selection line as any of the second string selection lines. An address decoder controls the signals applied to the first and second string selection lines in accordance with a received address of memory cells to be accessed.

BRIEF DESCRIPTION OF THE DRAWINGS

The forgoing and other features of the disclosure will be described below in more detail with reference to the accompanying drawings of non-limiting embodiments of the disclosure in which like reference characters refer to like parts throughout the different views. The drawings are not necessarily drawn to scale, emphasis instead being placed upon illustrating principles of the disclosure. In the drawings.

DETAILED DESCRIPTION

Figure 1:
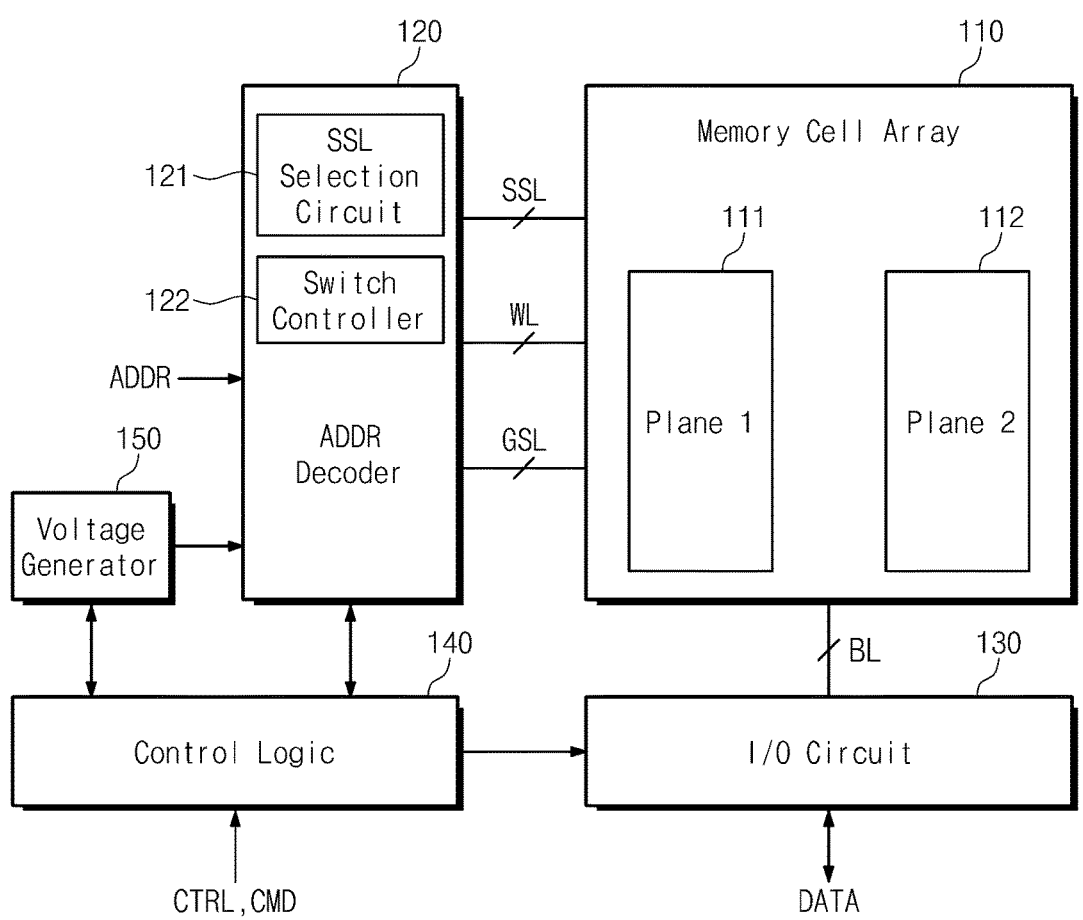
FIG. 1 is a block diagram of a nonvolatile memory device according to example embodiments of the disclosure.

Example embodiments will now be described more fully with reference to the accompanying drawings, in which some example embodiments are shown. Example embodiments may, however, be embodied in many different forms and should not be construed as being limited to the embodiments set forth herein; rather, these example embodiments are provided so that this disclosure will be thorough and complete, and will fully convey the scope of example embodiments of the disclosure to those of ordinary skill in the art. In the drawings, the thicknesses of layers and regions are exaggerated for clarity. Like reference characters and/or numerals in the drawings denote like elements, and thus their description may be omitted.

Below, a nonvolatile memory device is used as one example for illustrating characteristics and functions of the present disclosure. However, those skilled in the art can easily understand other advantages and performances of the present disclosure according to the descriptions. The present disclosure may be embodied or applied through other embodiments. Besides, the detailed description may be amended or modified according to viewpoints and applications, not being out of the scope, technical idea and other objects of the present disclosure. Throughout the specification, it will be explained that terms of "write" and "program" have the same meaning.

In example embodiments of the disclosure, a three-dimensional (3D) memory array is provided. The 3D memory array is monolithically formed in one or more physical levels of arrays of memory cells having an active area disposed above a silicon substrate. Circuitry associated with the operation of those memory cells may be above or within such substrate. The term "monolithic" means that layers of each level of the array are directly deposited on the layers of each underlying level of the array.

In example embodiments of the disclosure, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

FIG. 1 is a block diagram of a nonvolatile memory device 100 according to example embodiments of the disclosure. As illustrated, the nonvolatile memory device 100 includes a memory cell array 110, an address decoder 120, an input/output (I/O) circuit 130, a control logic 140, and a voltage generator 150.

The memory cell array 110 is connected to the address decoder 120 through wordlines WL. The memory cell array 110 is connected to the I/O circuit 130 through bitlines BL. The memory cell array 110 includes at least one plane. For example, the memory cell array 110 may include a first plane 111 and a second plane 112. Each of the planes 111 and 112 includes a plurality of memory blocks BLK1 to BLKz. Each of the memory blocks BLK1 to BLKz includes a plurality of NAND cell strings. In example embodiments, a plurality of cell strings may be selected through a plurality of string select lines SSL or a plurality of ground select lines GSL.

A channel of each cell string may be formed in a vertical direction. In the memory cell array 110, a plurality of wordlines may be stacked in a vertical direction and a channel of each cell string may be formed in a vertical direction. A memory device in which the memory cell array 110 is formed to have the above-described cell string structure may be referred to as a vertical nonvolatile memory device or a three-dimensional nonvolatile memory device. Each cell string includes at least one ground select transistor, a plurality of memory cells, and at least one string select transistor that are stacked in a direction perpendicular to a substrate. Each of the memory cells of the memory cell array 110 may be used as a single-level cell (SLC) or a multi-level cell (MLC).

The voltage generator 150 generates voltages to be provided to the address decoder 120 in response to the control of the control logic 140. For one example, during a program operation, the voltage generator 150 generates a wordline voltage such as a program voltage Vpgm, a pass voltage Vpass, and a program verify voltage Vfy in response to the control of the control logic 140 and provides the generated wordline voltage to the address decoder 120. For another example, during a read operation, the voltage generator 150 generates a wordline voltage such as a select read voltage Vr and an unselect read voltage Vread in response to the control of the control logic 140 and provides the generated wordline voltage to the address decoder 120. In each of the examples, the address decoder 120 may selectively apply received wordline voltages to wordlines WL according to the control of the control logic 140.

The address decoder 120 selects at least one of a plurality of pages of the memory cell array 110 in response to an externally received address ADDR and the control of the control logic 140. The address decoder 120 receives a wordline voltage from the voltage generator 150 and transfers the received wordline voltage to the selected page.

For example, the address decoder 120 may select any one of the memory blocks of the memory cell array 110 in response to the address ADDR. The address decoder 120 may select any one of a plurality of wordlines WL in response to the address ADDR. A single page may be selected by selecting a single string select line and a single wordline.

During a program operation, the address decoder 120 may select a single page and transfer the program voltage Vpgm and the program verify voltage Vfy to a selected wordline WL to which the selected page belongs. The address decoder 120 may transfer the pass voltage Vpass to an unselected wordline WL.

During a read operation, the address decoder 120 may select a single page and transfer the select read voltage Vr to a selected wordline to which the selected page belongs. The address decoder 120 may transfer an unselect read voltage Vread to an unselected wordline WL.

The I/O circuit 130 receives data DATA from an external entity and stores the received data DATA in the memory cell array 110. The I/O circuit 130 reads the data DATA stored in the memory cell array 110 and transfers the read data DATA to the external entity. In example embodiments, the I/O circuit 130 may include conventional components such as a column selection gate, a page buffer, and a data buffer. Alternatively, the I/O circuit 130 may include conventional components such as a column selection gate, a write driver, a sense amplifier, and a data buffer.

The control logic 140 receives a command CMD and a control signal CTRL from an external entity and controls the overall operation of the nonvolatile memory device 100. For example, the control logic 140 receives a program command from the external entity and controls the overall program operation of the nonvolatile memory device 100. Alternatively, the control logic 140 receives a read command from an external entity and controls the overall operation of the nonvolatile memory device 100.

In example embodiments, the nonvolatile memory device 100 may independently select at least one cell string through a string select line that is exclusively connected to a single plane. For example, a single string select line is exclusively connected to only a single plane, and corresponds to at least one of multiple cell strings included in the connected plane. The nonvolatile memory device 100 may apply a select voltage to a string select line to independently select at least one corresponding cell string. The nonvolatile memory device 100 may apply an unselect voltage to a string select line to independently unselect at least one corresponding cell string.

For example, the address decoder 120 may include a string select line selection circuit (hereinafter referred to as "SSL selection circuit") 121 and a switch controller 122. The switch controller 122 may receive an address ADDR to store an address of a string select line (hereinafter referred to as "SSL address") corresponding to each plane. The switch controller 122 may control the SSL selection circuit 121 according to an SSL address corresponding to each plane. The SSL selection circuit 121 may include an SSL switch corresponding to each plane. The SSL selection circuit 121 may independently select or unselect string select lines of each plane according to an SSL address corresponding to each plane received from the switch controller 122.

As described above, cell strings are selected by a string select line exclusively connected to a single plane. Accordingly, when a defect occurs at a certain string select line, performance loss occurs only at a single plane connected to the string select line where the defect occurs (hereinafter referred to as "defective select line"). As a result, cell strings included in the other planes may be normally selected to minimize the number of cell strings that suffer from malfunction caused by the defect of the string select line.

Figure 2:
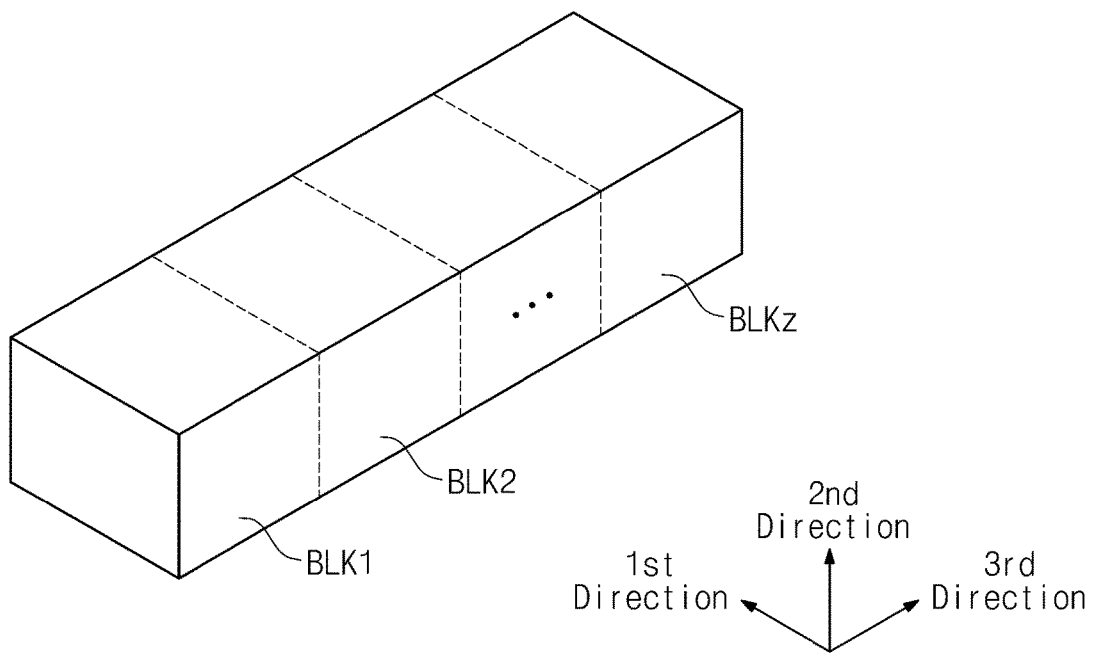
FIG. 2 is a block diagram of a memory cell array in FIG. 1.

FIG. 2 is a block diagram of the memory cell array 110 in FIG. 1. As illustrated, the memory cell array 110 may include a plurality of memory blocks BLK1 to BLKz. Each of the memory blocks BLK1 to BLKz may have a three-dimensional structure. For example, each of the memory blocks BLK1 to BLKz may include structures extending in first to third directions. Each of the memory blocks BLK1 to BLKz may include a plurality of NAND strings NS extending in the second direction. A plurality of NAND strings may be provided in the first and third directions.

Each of the memory blocks BLK1 to BLKz may be connected to a plurality of bitlines BL, a plurality of string select lines SSL, a plurality of ground select lines GSL, a plurality of wordlines WL, and a common source line CSL. Each of the NAND strings may be connected to a bitline BL, a string select line SSL, a ground select line GSL, wordlines WL, and a common source line CSL.

The memory blocks BLK1 to BLKz may be selected by the address decoder 120 shown in FIG. 1. For example, the address decoder 120 may be configured to select a memory block BLK corresponding to a decoded row address among the memory blocks BLK1 to BLKz.

Figure 3:
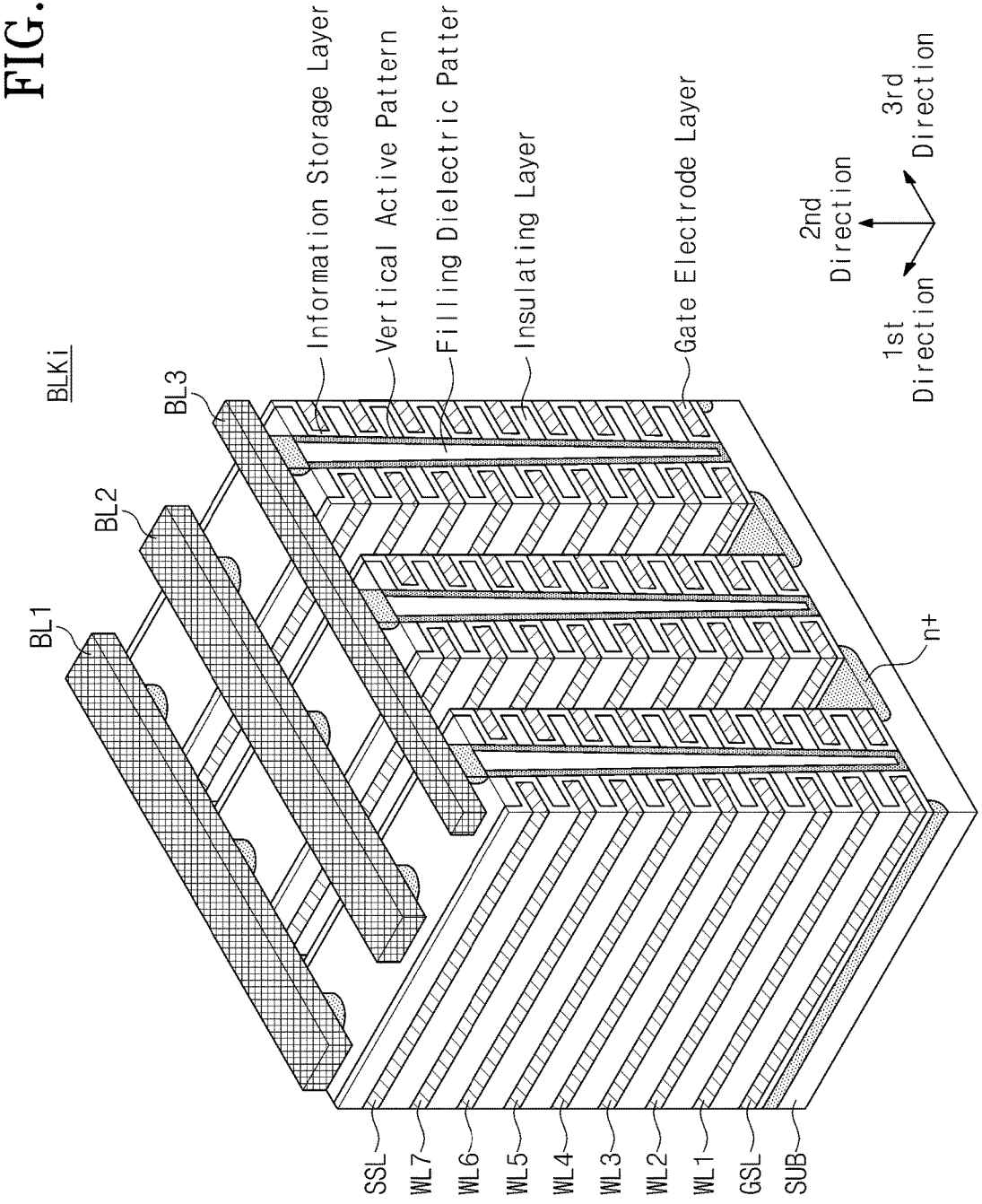
FIG. 3 is a perspective view illustrating an embodiment corresponding to a memory block in FIG. 2.

FIG. 3 is a perspective view illustrating an embodiment corresponding to a memory block BLKi in FIG. 2. As illustrated, the memory block BLKi may be disposed in a direction perpendicular to a substrate SUB. An $n^+$ doped region may be formed on the substrate SUB.

Gate electrode layers and insulating layers may be alternately stacked on the substrate SUB. An information storage layer may be disposed between the gate electrode layer and the insulating layer. When the gate electrode layer and the insulating are vertically patterned, a V-shaped pillar may be formed. The pillar may be connected to the substrate SUB through the gate electrode layer and the insulating layer. The inside of the pillar may be a filling dielectric pattern, which may be made of an insulating material such as silicon oxide. The outside of the pillar may be a vertical active pattern, which may be made of a channel semiconductor.

The gate electrode layer of the memory block BLKi may be connected to a ground select line GSL, a plurality of wordlines WL1 to WL7, and a string select line SSL. The pillar of the memory block BLKi may be connected to a plurality of bitlines BL1 to BL3. In FIG. 3, it is shown that the memory block BLKi includes two selection lines GSL and SSL, seven wordlines WL1 to WL7, and three bitlines BL1 to BL3. However, their numbers are not limited thereto.

Figure 4:
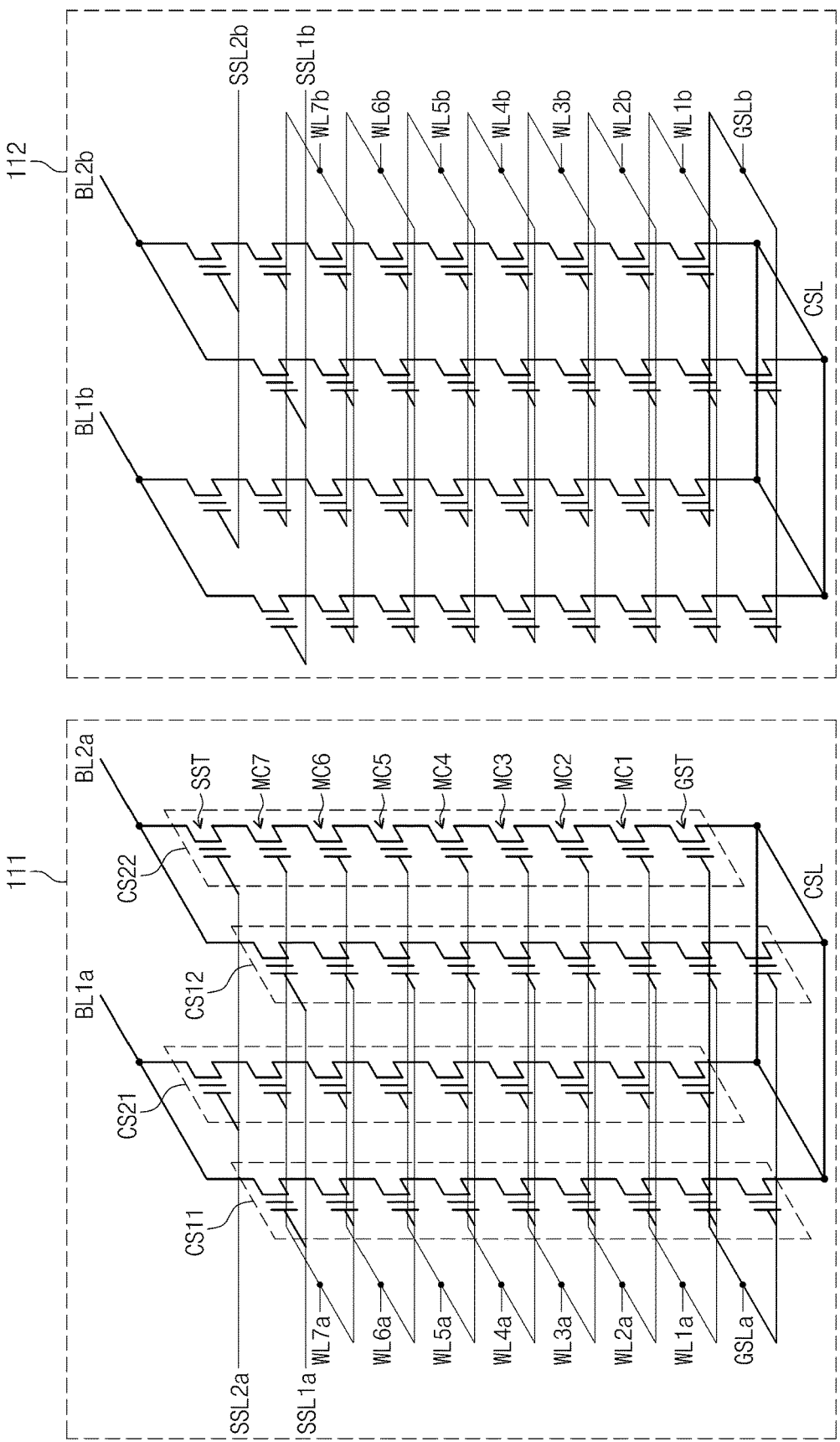
FIG. 4 is a circuit diagram illustrating a cell string selection structure of a nonvolatile memory device according to example embodiments of the disclosure.

FIG. 4 is a circuit diagram illustrating a cell string selection structure of a nonvolatile memory device according to example embodiments of the disclosure. As illustrated, a memory cell array may include a first plane 111 and a second plane 112. A plurality of memory blocks may be included in the first and second planes 111 and 112. A plurality of cell strings are included in each of the memory blocks. For example, a plurality of cell strings CS11, CS12, CS21, and CS22 are included in one of the memory blocks included in the first plane 111. Each of the planes 111 and 112 may include a plurality of memory blocks, and one of the memory blocks may include a plurality of string select lines SSL1a and SSL2a configured to select at least one of the cell strings CS11, CS12, CS21, and CS22. For example, when a select voltage is applied to the first string select line SSL1a of the first plane 111, the first and second cell strings CS11 and CS12 may be selected. Similarly, when a select voltage is applied to the second string select line SSL2a of the first plane 111, the third and fourth cell strings CS21 and CS22 may be selected.

In example embodiments, the first and second planes 111 and 112 may have substantially the same physical structure. For example, similar to the first plane 111, the second plane 112 may include a plurality of memory blocks and a plurality of cell strings disposed on a single plane. Similarly, the second plane 112 may include a plurality of string select lines SSL1b and SSL2b configured to select at least one of multiple cell strings.

The first and second planes 111 and 112 do not share a wordline, a bitline, a string select line, a ground select line, and a common source line. An example has been described where each plane is connected to two bitlines and seven wordlines. However, each plane may be connected to three or more bitlines and seven or more or less wordlines. For example, first plane 111 is connected to bitlines BL1a and BL2a, wordlines WL1a-WL7a, and ground selection line GSLa, whereas second plane 112 is connected to bitlines BL1b and BL2b, wordlines WL1b-WL7b, and ground selection line GSLb.

Each of the cell strings CS11, CS12, CS21, and CS22 includes at least one string select transistor, memory cells, and at least one ground select transistor. For example, a single ground select transistor GST, a plurality of memory cells MC1 to MC7, and a single string select transistor SST are sequentially formed at the single cell string CS22 to be perpendicular to a substrate. The other cell strings also have the same structure as the cell string CS22.

In example embodiments, a string select line connected to each of the planes 111 and 112 is exclusively connected to only one corresponding plane. For example, each of the string select lines SSL1a and SSL2a is connected to only the first plane 111. Similarly, each of the string select lines SSL1b and SSL2b is connected to only the second plane 112. Thus, a single string select line may select only cell strings include in a single plane. In addition, each string select line may be independently controlled to independently select cell strings in each plane.

For example, a select voltage may be independently applied to the first string select line SSL1a to independently select the cell strings CS11 and CS12. When the select voltage is applied to the first string select line SSL1a, the select voltage turns on a string select transistor of the corresponding cell strings CS11 and CS12. When the string select transistor is turned on, memory cells of the cell strings CS11 and CS12 and a bitline are electrically connected to each other.

Meanwhile, when an unselect voltage is applied to the first string select line SSL1a, the string select transistor of the cell strings CS11 and CS12 may be turned off and the cell strings CS11 and CS12 may be unselected. Thus, the memory cells of the cell strings CS11 and CS12 are electrically insulated from a bitline.

According to the above-described configuration, string select lines separated in each plane are provided. The separated string select line structure may minimize an effect caused by a defect that occurs at some of the string select lines. The string select lines separated in each plane are advantageous in independently selecting a cell string in each plane. That is, cell strings included in the first plane 111 may be selected fully independently of cell strings included in the second plane 112. The independent selection structure allows the nonvolatile memory device 100 to be easily controlled.

Figure 5:
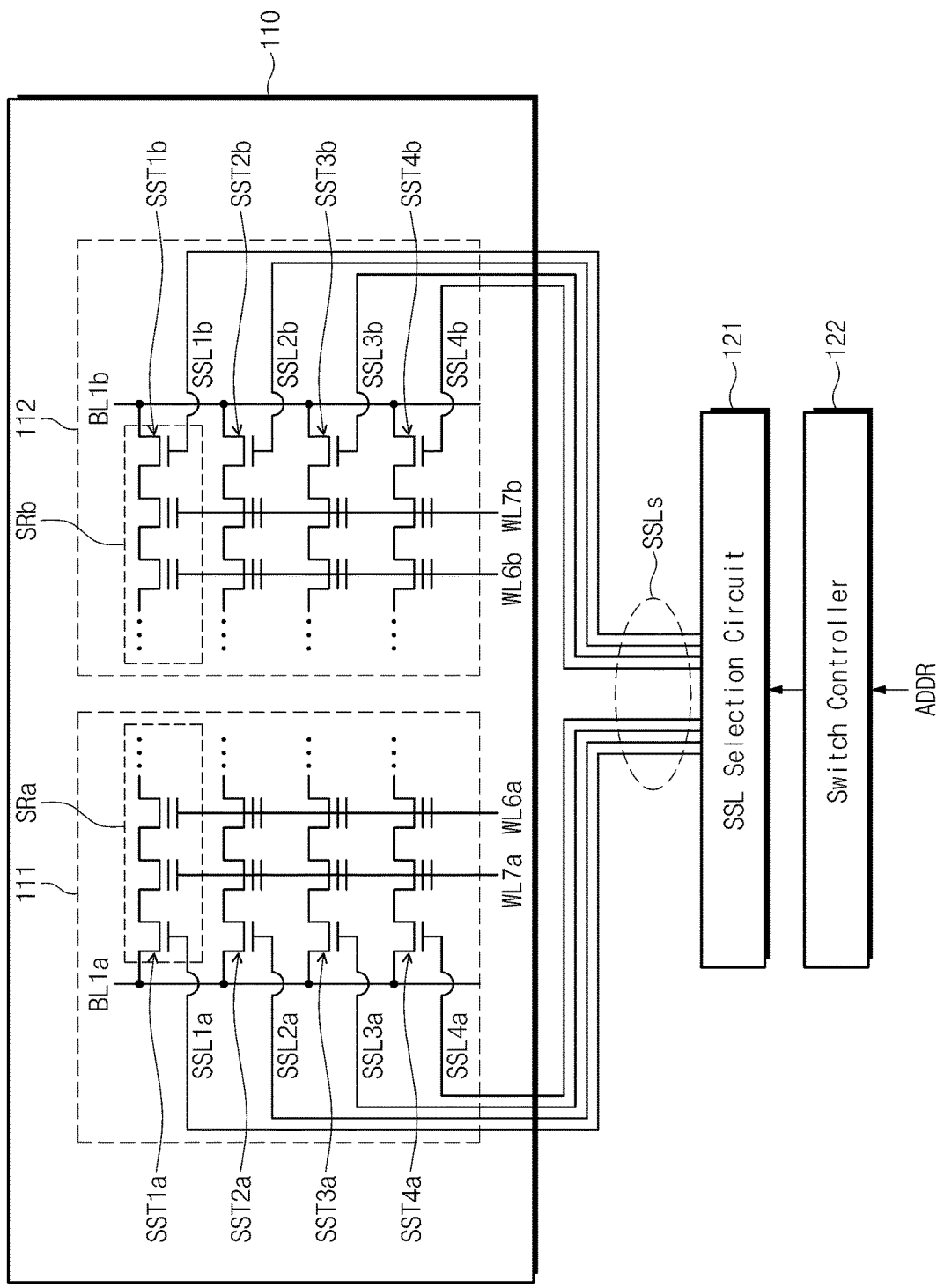
FIG. 5 illustrates a cell string selection method of a string select line switch and a switch controller according to example embodiments of the disclosure.

FIG. 5 illustrates a cell string selection method of a string select line switch and a switch controller according to example embodiments of the disclosure. Referring to FIG. 5, an SSL selection circuit 121 may independently select or unselect cell strings of a memory cell array 110 in each plane. In FIG. 5, it is shown that a single bitline is connected to each plane. For example, bitline BL1a is connected to first plane 111, and bitline BL1b is connected to first plane 112. However, this is merely exemplary and two or more bitlines may be connected to each plane. Planes 111 and 112 of the memory cell array 110 shown in FIG. 5 may have substantially the same structure as the planes 111 and 112 shown in FIG. 4.

The memory cell array 110 may include the first and second planes 111 and 112. Each of the first and second planes 111 and 112 includes a plurality of cell strings. Each of the cell strings may include at least one string select transistor and a plurality of memory cells. For example, the first plane 111 includes a plurality of cell strings connected to a bitline BL1a, and each of the cell strings includes string select transistors SST1a, SST2a, SST3a, and SST4a that electrically connect the bitline BL1a to memory cells. String select lines SSL1a, SSL2a, SSL3a, and SSL4a are connected to corresponding gates of the string select transistors SST1a, SST2a, SST3a, and SST4a, respectively.

Similarly, the second plane 112 includes a plurality of cell strings connected to a bitline BL1b and each of the cell strings includes string select transistors SST1b, SST2b, SST3b, and SST4b that electrically connect the bitline BL1b to the memory cells. String select lines SSL1b, SSL2b, SSL3b, and SSL4b are connected to corresponding gates of the string select transistors SST1b, SST2b, SST3b, and SST4b, respectively.

Unexplained components of the first and second planes 111 and 112 are identical to those explained in FIG. 4.

The SSL selection circuit 121 controls a plurality of string select lines SSLs. The string select lines SSLs includes a plurality of string select lines SSL1a, SSL2a, SSL3a, SSL4a, SSL1b, SSL2b, SSL3b, and SSL4b respectively corresponding to string select transistors SST1a, SST2a, SST3a, SST4a, SST1b, SST2b, SST3b, and SST4b.

The SSL selection circuit 121 may independently control each of the string select lines SSLs to independently select or unselect the cell strings of the first plane 111 or the second plane 112 in each plane. Specifically, the SSL selection circuit 121 may independently make each of a plurality of string select signals provided to the string select lines SSLs be a select voltage or an unselect voltage. The string select signals are applied to gate terminals of the string select transistors SST1a, SST2a, SST3a, SST4a, SST1b, SST2b, SST3b, and SST4b through the string select lines SSLs, respectively. The string select transistors SST1a, SST2a, SST3a, SST4a, SST1b, SST2b, SST3b, and SST4b are independently turned on or off depending on whether the applied selection signal is a select voltage.

For example, the SSL selection circuit 121 provides a select voltage to the first string select line SSL1a, corresponding to a cell string SRa included in the first plane 111, as a string select signal to select the cell string SRa. The first string select line SSL1a is connected to a gate terminal of a string select transistor SST1a of the cell string SRa, and the string select signal provided to the first string select line SSL1a turns on the string select transistor SST1a. When the string select transistor SST1a is turned on, the cell string SRa is electrically connected to the bitline BL1a. The first string select line SSL1a is connected to only the cell string SRa and does not affect the selection of other cell strings. That is, the cell string SRa may be selected independently of the other cell strings by the control of the first string select line SSL1a.

In FIG. 5, there is shown a structure where a single cell string corresponds to a single string select line. However, example embodiments of the disclosure are not limited to the structure. An example will be described where the first plane 111 is connected to a plurality of bitlines and the first string select line SSL1a is connected to two or more cell string cells. When a select voltage is applied to the first string select line SSL1a as a string select signal, two or more cell strings may be selected at the same time. Even in this case, the first string select line SSL1a is exclusively connected to only the first plane 111 and the two or more cell strings selected by the first string select line SSL1a are all cell strings of the first plane 111.

Similarly, the SSL selection circuit 121 applies a select voltage to the second string select line SSL1b corresponding to a cell string SRb included in the second plane 112 to select the cell string SRb. The cell string SRb may also be selected independently of other cell strings by the control of the second string select line SSL1b.

A switch controller 122 may control the SSL selection circuit 121 such that the SSL selection circuit 121 independently selects a string select line of each plane. For example, the switch controller 122 may include an address storage unit corresponding to each plane. An address storage unit corresponding to the first plane 111 stores a selected SSL address of the first plane 111. An address storage unit corresponding to the second plane 112 stores a selected SSL address of the second plane 112. The same SSL address may correspond to a string select line of the same position of each plane. For example, an SSL address corresponding to the string select line SSL1a of the first plane 111 has the same value as an SSL address corresponding to the string select line SSL1b of the second plane 112.

According to the above-described configuration, since cell strings of each of the planes 111 and 112 are selected by different SSL addresses, respectively, they may be selected or unselected independently of a cell string included in another plane. For example, when the first string select line SSL1a of the first plane 111 is selected, one of the second to fourth string select lines SSL2b, SSL3b, and SSL4b may be selected in the second plane 112.

Figure 6:
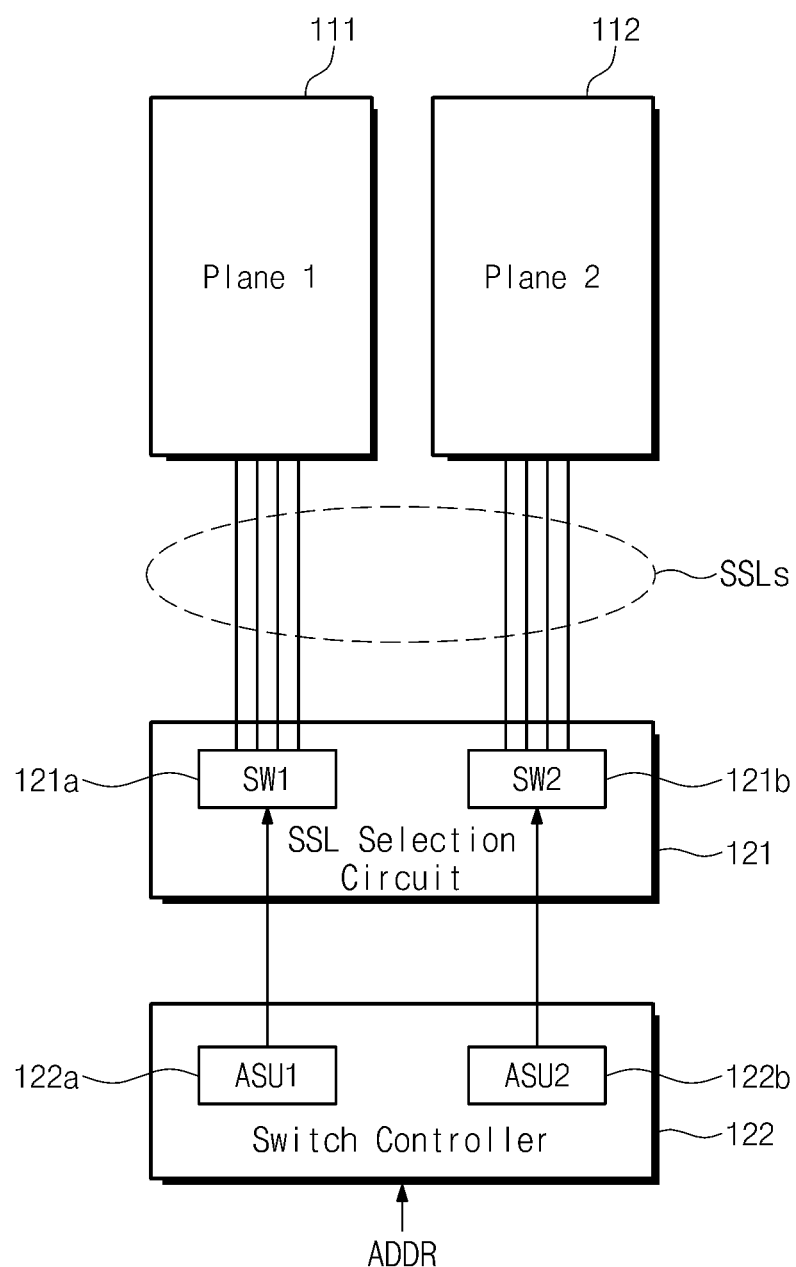
FIG. 6 illustrates an embodiment of the cell string select line switch and the switch controller in FIG. 5.

FIG. 6 illustrates an embodiment of the cell string select line selection circuit 121 and the switch controller 122 in FIG. 5. As illustrated, first and second planes 111 and 112 may be connected to an SSL selection circuit 121 through a plurality of string select lines SSLs.

The switch controller 122 may control the SSL selection circuit 121 such that the SSL selection circuit 121 independently selects a string select line of each plane. The switch controller 122 may extract an SSL address from a received address ADDR and store the extracted SSL address in an address storage unit 122a corresponding to the first plane 111 and an address storage unit 122b corresponding to the second plane 112. For example, the switch controller 122 may include the first and second address storage units 122a and 122b. The first address storage unit 122a may store an SSL address to be selected in the first plane 111. The second address storage unit 122b may store an SSL address to be selected in the second plane 112. The SSL address to be selected in the first plane 111 may be different from the SSL address to be selected in the second plane 112. For example, in FIG. 5, when the first string select line SSL1a of the first plane 111 is selected, one of the second to fourth string select lines SSL2b, SSL3b, and SSL4b may be selected in the second plane 112.

The SSL selection circuit 121 may include first and second switch circuits 121a and 121b. For example, the first switch circuit 121a may select or unselect string select lines of the first plane 111 according to an address stored in the first address selection unit 122a. The second switch circuit 121b may select or unselect string select lines of the second plane 112 according to an address stored in the second address selection unit 122b.

Thus, a string select line may be independently selected in each of the first and second planes 111 and 112. A nonvolatile memory device 100 may manage an error of a string select line in each plane. The nonvolatile memory device 100 may change only an SSL address of a plane in which an error occurs when a plurality of planes operate at the same time, thereby reducing performance degradation.

Figure 7:
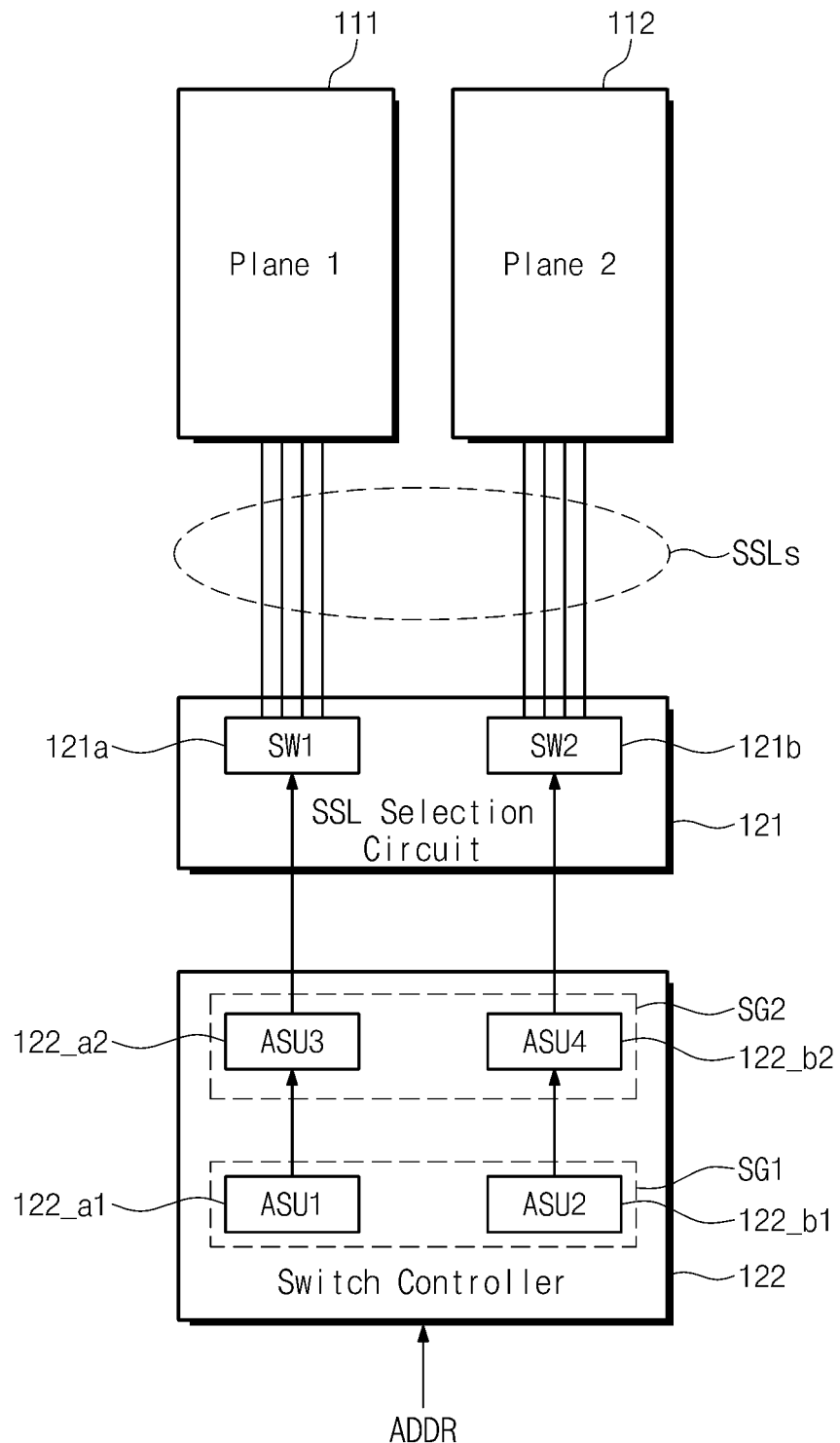
FIG. 7 illustrates another embodiment of the string select line switch and the switch controller in FIG. 5.

FIG. 7 illustrates another embodiment of the string select line selection circuit 121 and the switch controller 122 in FIG. 5. As illustrated, first and second planes 111 and 112 may be connected to an SSL selection circuit 121 through a plurality of string select lines SSLs. The switch controller 122 may constitute a plurality of stages to successively change and select string select lines of respective planes.

The switch controller 122 may control an SSL selection circuit 121 such that the SSL selection circuit 121 independently selects a string select line of each plane. The switch controller 122 may include address storage units including a plurality of stages. For example, the switch controller 122 may include first and second stages SG1 and SG2. The first stage SG1 may include address storage units 122_a1 and 122_b1. The address storage units 122_a1 and 122_b1 may include SSL addresses to be selected next in the first and second planes 111 and 112. The second stage SG2 may include address storage units 122_a2 and 122_b2. The address storage units may store SSL addresses to be currently selected in the first and second planes 111 and 112. The SSL address to be selected in the first plane 111 may be different from the SSL address to be selected in the second plane 112. For example, in FIG. 5, when the first string select line SSL1a of the first plane 111 is selected, one of the second to fourth string select lines SSL2b, SSL3b, and SSL4b may be selected in the second plane 112.

The SSL selection circuit 121 may include first and second switch circuits 121a and 121b. The SSL selection circuit 121 may select or unselect string select lines according to addresses stored in the second stage SG2. For example, the first switch 121a may select or unselect string select lines of the first plane 111 according to an address stored in the address selection unit 122_a2. The second switch circuit 121b may select or unselect string select lines of the second plane 112 according to an address stored in the address selection unit 122_b2.

Thus, each of the first and second planes 111 and 112 may select a string select line independently. A nonvolatile memory device 100 may manage an error of a string select line in each plane. The nonvolatile memory device 100 may change only an SSL address of a plane where an error occurs when a plurality of planes operate at the same time, thereby reducing performance degradation.

Figure 8:
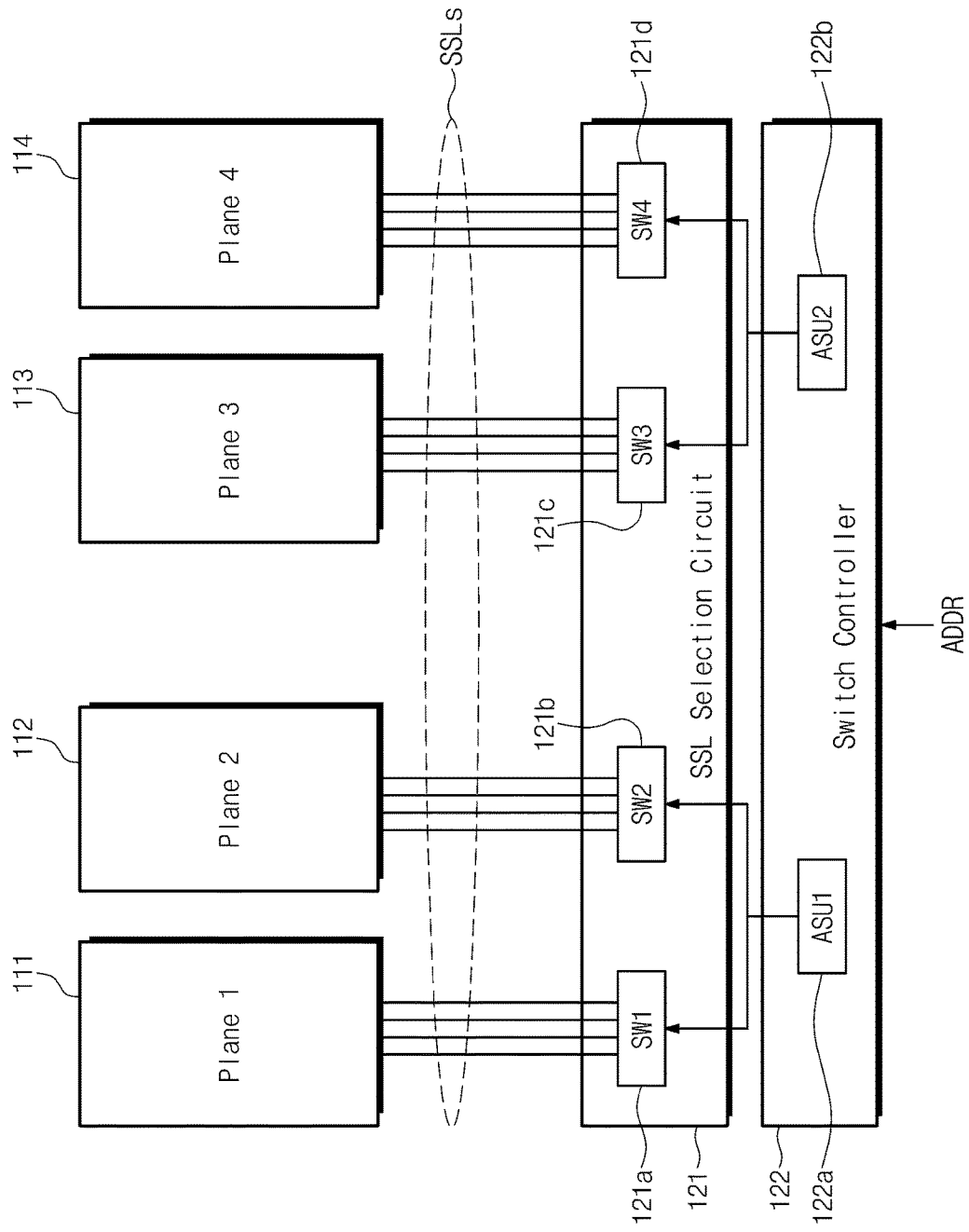
FIG. 8 illustrates another embodiment of the string select line switch and the switch controller in FIG. 5.

FIG. 8 illustrates another embodiment of the string select line selection circuit 121 and the switch controller 122 in FIG. 5. As illustrated, first to fourth planes 111, 112, 113, and 114 may be connected to an SSL selection circuit 121 through a plurality of selection lines SSLs. In FIG. 8, a nonvolatile memory device 100 may divide a plurality of planes into a plurality of groups and independently control a string select line according to each group.

The switch controller 122 may store at least two SSL addresses from a received address ADDR. For example, the switch controller 122 may include first and second address storage units 122a and 122b. The first address storage unit 122a may store an SSL address to be selected in the first and second planes 111 and 112. The second address storage unit 122b may store an SSL address to be selected in the third and fourth planes 113 and 114. The SSL address to be selected in the first and second planes 111 and 112 may be different from the SSL address to be selected in the third and fourth planes 113 and 114. For example, when a string select line of a first position in each plane is selected in the first and second planes 111 and 112, a string select line of a position different from the first position of each plane may be selected in the third and fourth planes 113 and 114.

The SSL selection circuit 121 may include first to fourth switch circuits 121a, 121b, 121c, and 121d. For example, the first switch circuit 121a may select or unselect string select lines of the first plane 111 according to an SSL address stored in the first address selection unit 122a. The second switch circuit 121b may select or unselect string select lines of the second plane 112 according to an SSL address stored in the first address selection unit 122a. The third switch circuit 121c may select or unselect string select lines of the third plane 113 according to an SSL address stored in the second address selection unit 122b. The fourth switch circuit 121d may select or unselect string select lines of the fourth plane 114 according to an SSL address stored in the second address selection unit 122b.

Accordingly, a first group including the first and second planes 111 and 112 and a second group including the third and fourth planes 113 and 114 may be adapted to independently select a string select line according to each group. The nonvolatile memory device 100 may manage an error of a string select line according to each group. The nonvolatile memory device 100 may change only an SSL address of a group in which an error occurs when a plurality of planes operate at the same time, thereby reducing performance degradation.

Figure 9:
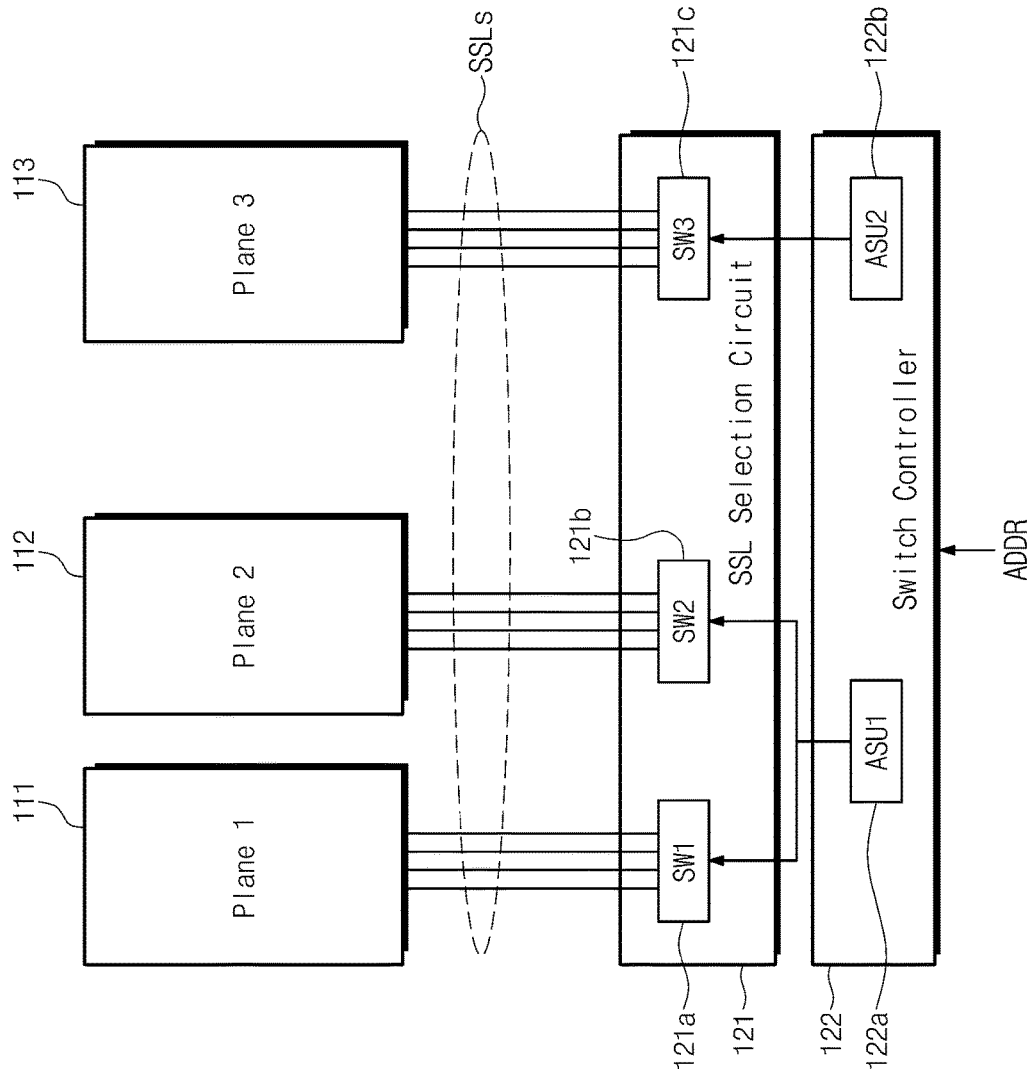
FIG. 9 illustrates another embodiment of the string select line switch and the switch controller in FIG. 5.

FIG. 9 illustrates another embodiment of the string select line selection circuit 121 and the switch controller 122 in FIG. 5. As illustrated, first to third planes 111, 112, and 113 may be connected to an SSL selection circuit 121 through a plurality of string select lines SSLs. In FIG. 9, a nonvolatile memory device 100 may divide a plurality of planes into a plurality of groups and independently control a string select line according to each group. The respective groups may include different numbers of planes.

The switch controller 122 may store at least two SSL addresses from a received address ADDR. For example, the switch controller 122 may include first and second address storage units 122a and 122b. The first address storage unit 122a may store an SSL address to be selected in the first and second planes 111 and 112. The second address storage unit 122b may store an SSL address to be selected in the third plane 113. An SSL address to be selected in the first and second planes 111 and 112 may be different from an SSL address to be selected in the third plane 113. For example, when a string select line of a first position of each plane is selected in the first and second planes 111 and 112, a string select line of a position different from the first position may be selected in the third plane 113.

The SSL selection circuit 121 may include first to third switch circuits 121a, 121b, and 121c. For example, the first switch circuit 121a may select or unselect string select lines of the first plane 111 according to an SSL address stored in the first address selection unit 122a. The second switch circuit 121b may select or unselect string select lines of the second plane 112 according to an SSL address stored in the first address selection unit 122a. The third switch circuit 121c may select or unselect string select lines of the third plane 113 according to an SSL address stored in the second address selection unit 122b.

Accordingly, a first group including the first and second planes 111 and 112 and a second group including the third plane 113 may be adapted to independently select a string select line according to each group. The nonvolatile memory device 100 may manage an error of a string select line according to each group. The nonvolatile memory device 100 may change only an SSL address of a group in which an error occurs when a plurality of planes operate at the same time, thereby reducing performance degradation.

Figure 10:
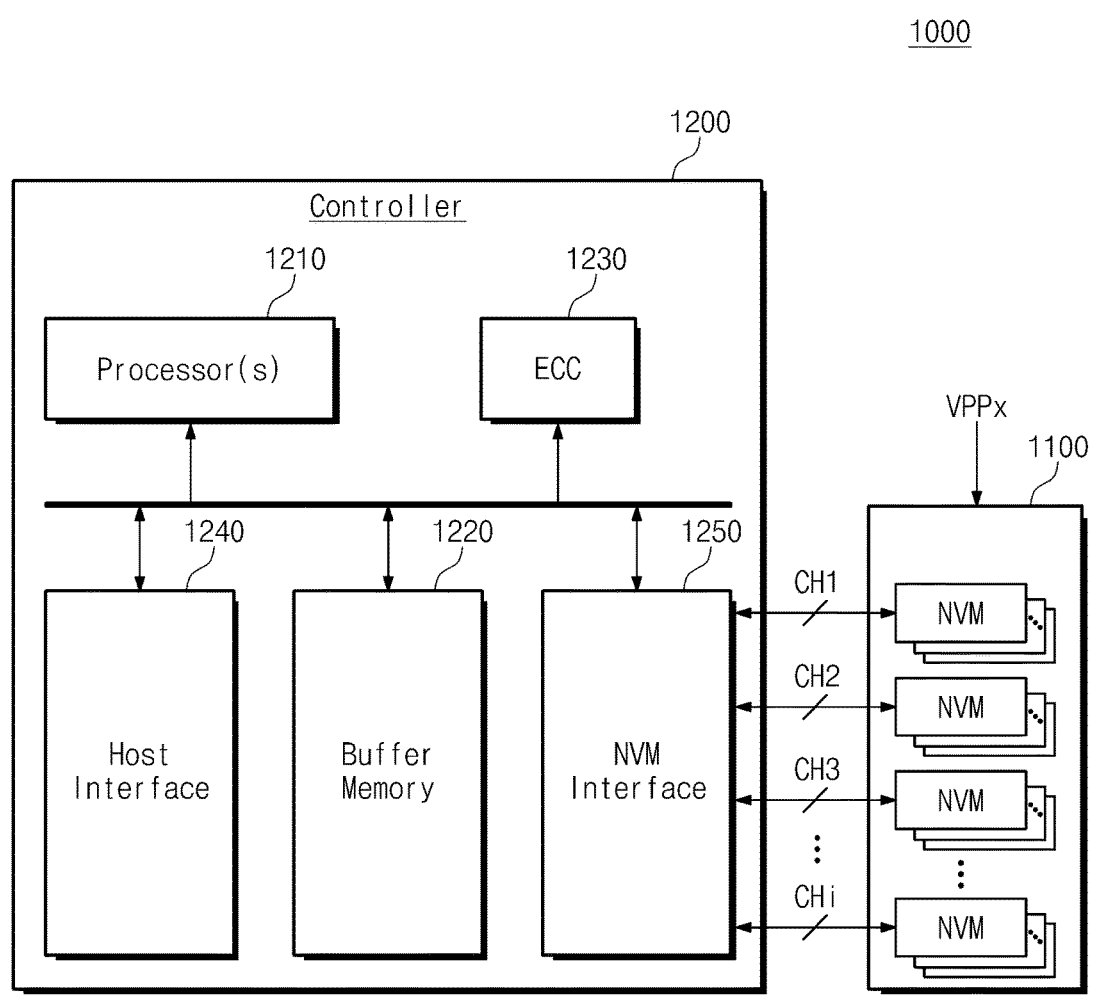
FIG. 10 is a block diagram of an SSD according to example embodiments of the disclosure.

FIG. 10 is a block diagram of an SSD 1000 according to example embodiments of the disclosure. As illustrated, the SSD 1000 may include a plurality of nonvolatile memory devices 1100 and an SSD controller 1200.

The nonvolatile memory devices 1100 may be implemented to selectively receive an external high voltage Vpp. Each of the nonvolatile memory devices 1100 may independently select or unselect a string select line in each plane, as described with reference to FIGS. 1 to 9. Thus, the nonvolatile memory devices 1100 may manage an operation error in each plane.

The SSD controller 1200 is connected to nonvolatile memory devices 1100 through a plurality of channels CH1 to CHi (i being an integer greater than or equal to 2). The SSD controller 1200 includes at least one processor 1210, a buffer memory 1220, an error correction circuit (ECC) 1230, a host interface 1240, and a nonvolatile memory interface 1250.

The buffer memory 1220 may temporarily store data required to drive the SSD controller 1200. The buffer memory 1220 may include a plurality of memory lines each storing data or a command.

The ECC 1230 may calculate an error correction code value of data to be programmed during a write operation, correct an error of read data using the error correction code value during a read operation, and correct an error of data recovered from nonvolatile memory device 1100 during a data recovery operation. Although not shown in FIG. 10, a code memory may be further included to store code data required to drive the SSD controller 1200. The code memory may be implemented with a nonvolatile memory device.

The host interface 1240 provides an interface with an external device. The host interface 1240 may be a NAND interface. The nonvolatile memory interface 1250 provides an interface with nonvolatile memory devices 1100.

Example embodiments of the disclosure may be applied to an embedded multimedia card (eMMC) (e.g., movi-NAND or iNAND).

Figure 11:
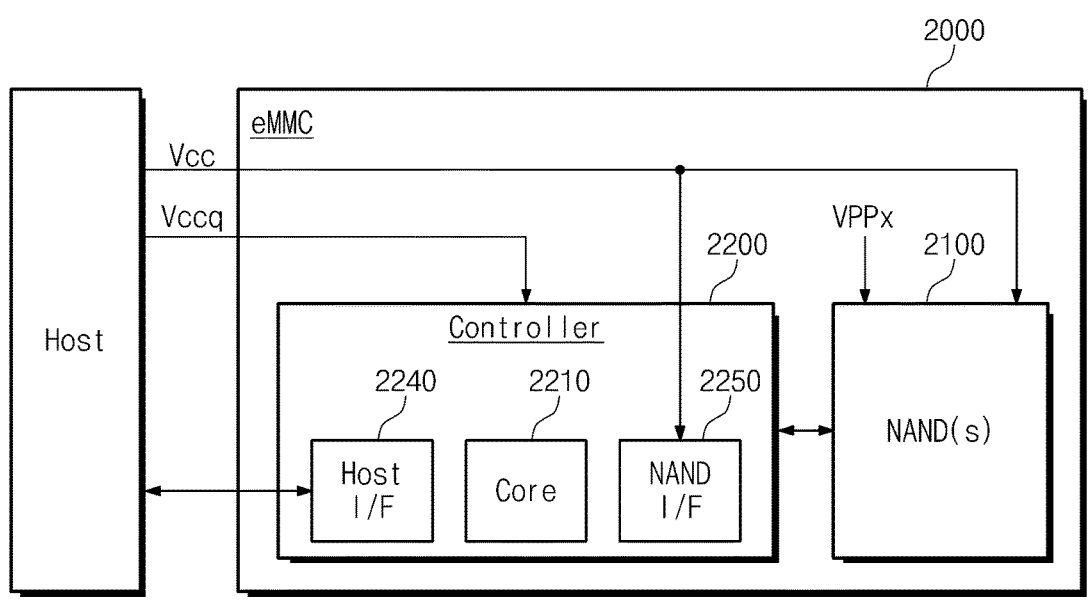
FIG. 11 is a block diagram of an eMMC according to example embodiments of the disclosure.

FIG. 11 is a block diagram of an eMMC 2000 according to example embodiments of the disclosure. As illustrated, the eMMC 2000 may include at least one NAND flash memory device 2100 and a controller 2200.

The NAND flash memory device 2100 may be a single data rate (SDR) or a double data rate (DDR) NAND flash memory. Alternatively, the NAND flash memory device 2100 may be a vertical NAND (VNAND) flash memory device. Each of the NAND flash memory devices 2100 may independently select or unselect a string select line in each plane, as described with reference to FIGS. 1 to 9. Thus, the NAND flash memory device 2100 may manage an operation error in each plane.

The controller 2200 is connected to the NAND flash memory device 2100 through a plurality of channels. The controller 2200 may include at least one controller core 2210, a host interface 2240, and a NAND interface 2250. The at least one controller core 2210 may control the overall operation of eMMC 2000. The host interface 2240 is configured to perform interfacing between the controller 2210 and a host. The NAND interface 2250 is configured to perform interfacing between the NAND flash memory device 2100 and the controller 2200. In some example embodiments, the host interface 2240 may be a parallel interface (e.g., an MMC interface). In other example embodiments, the host interface 2240 may be a serial interface (e.g., UHS-II, UFS, etc.).

The eMMC 2000 receives power supply voltages Vcc and Vccq from the host. A first power supply voltage Vcc (e.g., about 3.3 volts) is supplied to the NAND flash memory device 2100 and the NAND interface 2250, and a second power supply voltage Vccq (e.g., about 1.8 volt/3.3 volts) is supplied to the controller 2200. In example embodiments, the eMMC 2000 may be selectively supplied with an external high voltage Vpp.

Example embodiments of the disclosure may be applied to a universal flash storage (UFS) system.

Figure 12:
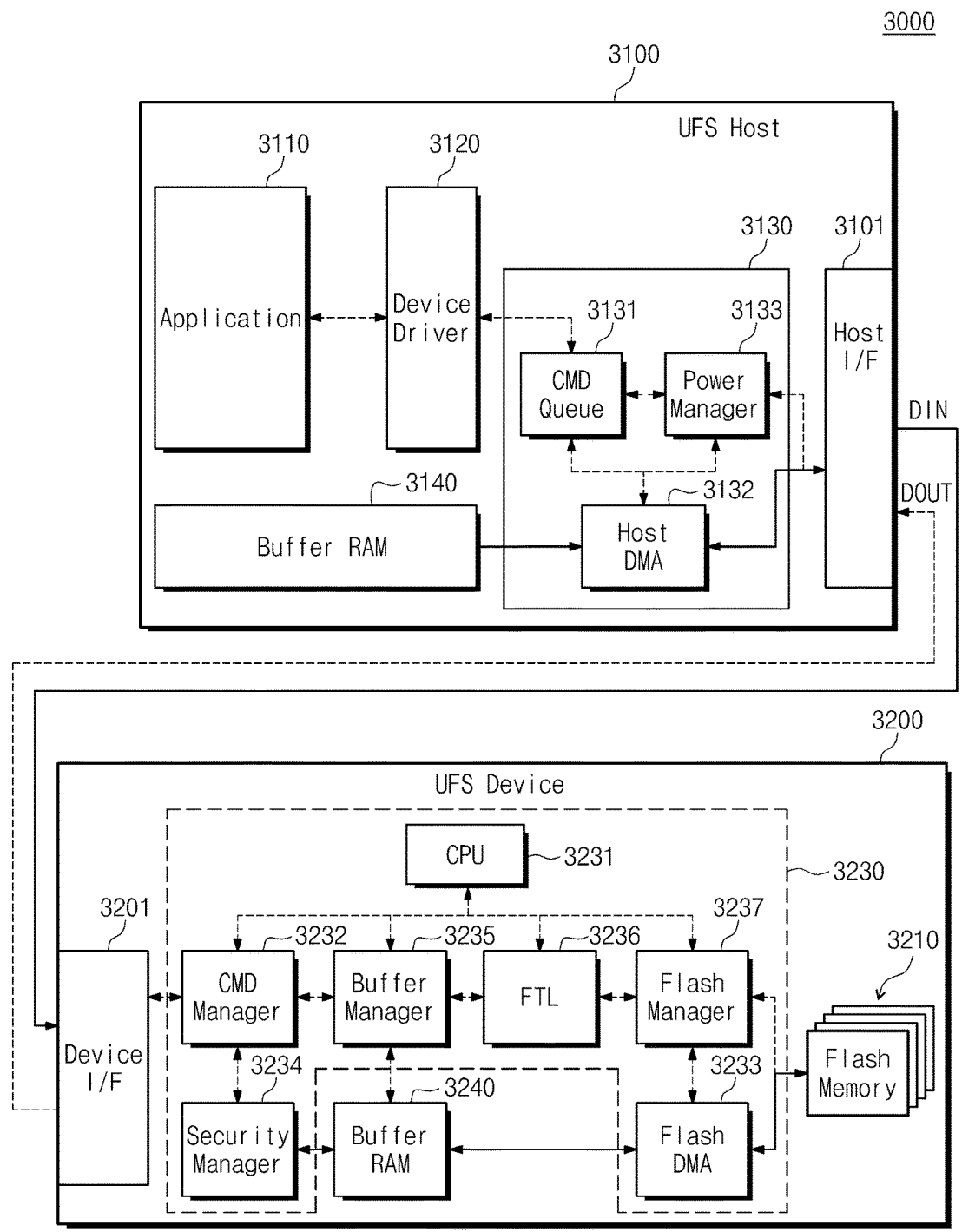
FIG. 12 is a block diagram of a UFS system according to example embodiments of the disclosure.

FIG. 12 is a block diagram of a UFS system 3000 according to example embodiments of the disclosure. As illustrated, the UFS system 3000 may include a UFS host 3100 and a UFS device 3200.

The UFS host 3100 may include an application 3110, a device driver 3120, a host controller 3130, and a buffer RAM 3140. The host controller 3130 may include a command queue 3131, a host DMA 3132, and a power manager 3133. In the host controller 3130, the command queue 3131, the host DMA 3132, and the power manager 3133 may operate with an algorithm, software or firmware.

A command (e.g., a write command) generated in the application 3110 and the device driver 3120 of the UFS host 3100 may be input to the command queue 3131 of the host controller 3130. The command queue 3131 may sequentially store commands to be provided to the UFS device 3200. The command stored in the command queue 3131 may be provided to the host DMA 3132. The host DMA 3132 may transmit a command to the UFS device 3200 through the host interface 3101.

Continuing to refer to FIG. 12, the UFS device 3200 may include a flash memory 3210, a device controller 3230, and a buffer RAM 3240. The device controller 3230 may include a central processing unit (CPU) 3231, a command manger (CMD manager) 3232, a flash DMA 3233, a security manager 3234, a buffer manager 3235, a flash translation layer (FTL) 3236, and a flash manager 3237. In the device controller 3230, the command manager 3232, the security manager 3234, the buffer manager 3235, the flash translation layer 3236, and the flash manager 3237 may operate with an algorithm, software or firmware.

The flash memory 3210 may independently select or unselect a string select line in each plane, as described with reference to FIGS. 1 to 9. Thus, the flash memory 3210 may manage an operation error in each plane.

The command input from the UFS host 3100 to the UFS 3200 may be provided to the command manager 3232 through the device interface 3201. The command manager 3232 may interpret the command provided from the UFS host 3100 and authenticate the input command using the security manager 3234. The command manager 3232 may allocate the buffer RAM 3240 to receive data through the buffer manager 3235. The command manager 3232 transfers a ready_to_transfer UPIU (RTT UPIU) to the host 3100 when data transfer readiness is completed.

The UFS host 3100 may transfer data to the UFS device 3200 in response to the RTT UPIU. The data may be transferred to the UFS device 3200 through the host interface 3101. The UFS device 3200 may store the received data in the buffer RAM 3240 through the buffer manager 3235. The data stored in the buffer RAM 3240 may be provided to the flash manager 3237 through the flash DMA 3233. The flash manager 3237 may store data in a selected address of the flash memory 3210 with reference to address mapping information of the flash translation layer 3236.

The UFS device 3200 transmits a response signal indicating completion of a command to the device driver 3120 of the UFS host 3100 through an interface when transfer of data required for the command and a program are completed. The UFS host 3100 may inform the device driver 3120 and the application 3110 of the completion of the command and complete an operation on the command.

Example embodiments of the disclosure may be applied to a mobile device.

Figure 13:
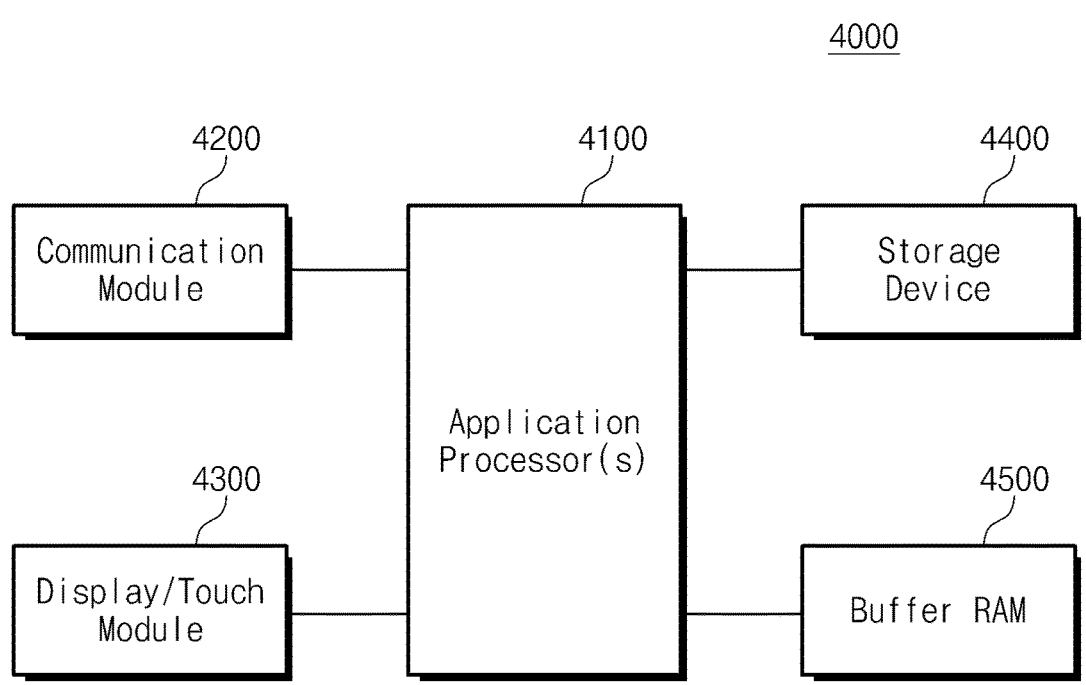
FIG. 13 is a block diagram of a mobile device according to example embodiments of the disclosure.

FIG. 13 is a block diagram of a mobile device 4000 according to example embodiments of the disclosure. As illustrated, the mobile device 4000 may include an application processor 4100, a communication module 4200, a display/touch module 4300, a storage device 4400, and a mobile buffer RAM 4500.

The application processor 4100 controls the overall operation of the mobile device 4000. The communication module 4200 may be configured to perform wireless/wired communications with an external device. The display/touch module 4300 may be configured to display data processed by the application processor 4100 or receive data through a touch panel. The storage device 4400 may be configured to store user data. The storage device 4400 may be an eMMC, an SSD or a UFS device. The mobile buffer RAM 4500 may be configured to temporarily store data required for a processing operation of the mobile device 4000.

The storage device 4400 may independently select or unselect a string select line in each plane, as described with reference to FIGS. 1 to 9. Thus, the storage device 4400 may manage an operation error each plane.

A memory system or a storage device according to example embodiments of the disclosure may be packaged using various types of packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), or the like.

As described above, there is provided a nonvolatile memory device having a multi-plane structure in which string select line addresses of planes are stored in different address storage units to independently select cell strings in each of the planes.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

The above-disclosed subject matter is to be considered illustrative, and not restrictive, and the appended claims are intended to cover all such modifications, enhancements, and other features, which fall within the true spirit and scope of the disclosure. Thus, to the maximum extent allowed by law, the scope of the disclosure is to be determined by the broadest permissible interpretation of the following claims and their equivalents, and shall not be restricted or limited by the foregoing detailed description. While some example embodiments have been particularly shown and described, it will be understood by one of ordinary skill in the art that variations in form and detail may be made therein without departing from the spirit and scope of the claims.

What is claimed is:

1. A method for operating a nonvolatile memory device including a memory cell array including a first plane and a second plane, the method comprising:

receiving a first command and a first address associated with the first plane and receiving a second command and a second address associated with the second plane;

extracting a first string select line address indicating a first string select line of the first plane from the first address and storing the first string select line address, and extracting a second string select line address indicating a second string select line of the second plane from the second address and storing the second string select line address; and selecting the first string select line according to the first string select line address and selecting the second string select line according to the second string select line address.

2. The method as set forth in claim 1, wherein:
first and second values of the first and second string select line addresses are different from each other.

3. The method as set forth in claim 2, wherein:
a first location of the first string select line in the first plane and a second location of the second string select line in the second plane are different from each other.

4. The method as set forth in claim 1, wherein:
the first address includes the first string select line address, an address of the first plane, an address of a first memory block in which the first string select line is located, and addresses of a first word line and a first bit line indicating a first memory cell selected through the first string select line, and
the second address includes the second string select line address, an address of the second plane, an address of a second memory block in which the second string select line is located, and addresses of a second word line and a second bit line indicating a second memory cell selected through the second string select line.

5. The method as set forth in claim 1, wherein:
the selecting the first string select line and selecting the second string select line includes providing a first string select signal to the first string select line and providing a second string select signal to the second string select line, and
the providing the first string select signal and the providing the second string select signal are independent of each other.

6. The method as set forth in claim 1, wherein:
the first command is a first program command or a first read command associated with the first plane, and
the second command is a second program command or a second read command associated with the second plane.

7. The method as set forth in claim 1, wherein:
memory cells of the first and second planes are selectively accessed in accordance with signals applied to word lines, bit lines, and ground select lines, and
the first and second planes do not share any of the word lines, bit lines, and ground select lines.

8. A nonvolatile memory device comprising:
a memory cell array including first memory blocks and second memory blocks; and
an address decoder connected to the first memory blocks through first string select lines and connected to the second memory blocks through second string select lines and configured to provide a string select signal to the first and second string select lines, wherein:
the address decoder independently provides the string select signal to the first and second string select lines based on first and second string select line addresses respectively corresponding to the first and second string select lines,
memory cells of the first and second memory blocks are selectively accessed in accordance with signals applied to word lines, bit lines, and ground select lines, and
the first and second memory blocks do not share any of the word lines, bit lines, and ground select lines.

9. The nonvolatile memory device as set forth in claim 8, wherein:
first and second values of the first and second string select lines addresses are different from each other.

10. The nonvolatile memory device as set forth in claim 9, wherein:
first locations of the first string select lines in the first memory blocks and second locations of the second string select lines in the second memory blocks are different from each other.

11. The nonvolatile memory device as set forth in claim 8, wherein:
the address decoder includes a string select line selection circuit configured to provide the string select signal to each of the first and second memory blocks, and
the string select line selection circuit includes a first string switch configured to control the first string select lines according to the first string select line address and a second string switch configured to control the second string select lines according to the second string select line address.

12. The nonvolatile memory device as set forth in claim 11, wherein:
the address decoder includes a switch controller configured to store the first and second string select line addresses, and
the switch controller extracts the first and second string select line addresses from externally received addresses and includes a first address storage unit configured to store the first string select line address and a second address storage unit configured to store the second string select line address.

13. The nonvolatile memory device as set forth in claim 8, wherein:
the address decoder is further connected to the first memory blocks through third string select lines and is further connected to the second memory blocks through fourth string select lines,
the address decoder includes a string select line selection circuit configured to provide the string select signal to each of the first and second memory blocks, and
the string select line selection circuit includes a first string switch configured to control the first string select lines according to the first string select line address or the third string select lines according to a third string select line address, and a second string switch configured to control the second string select lines according to the second string select line address or control the fourth string select lines according to a fourth string select line address.

14. The nonvolatile memory device as set forth in claim 13, wherein:
the address decoder further includes a switch controller configured to store the first to fourth string select line addresses, and
the switch controller includes a first stage configured to store the first and second string select line addresses and a second stage configured to store the third and fourth string select line addresses.

15. The nonvolatile memory device as set forth in claim 14, wherein:
the first stage stores the third and fourth string select line addresses after the address decoder provides the string select signal to each of the first and second memory blocks.

* * * * *